United States Patent

Sun et al.

[19]

[11] Patent Number: 6,054,335
[45] Date of Patent: Apr. 25, 2000

[54] FABRICATION OF SCANNING III-V COMPOUND LIGHT EMITTERS INTEGRATED WITH SI-BASED ACTUATORS

[75] Inventors: Decai Sun, Sunnyvale; Ross D. Bringans, Cupertino; Christopher L. Chua, Mountain View; Philip D. Floyd, Sunnyvale; Eric Peeters, Fremont, all of Calif.; Joel A. Kubby, Rochester; Alex T. Tran, Ithaca, both of N.Y.

[73] Assignee: Xerox Corporation, Stamford, Conn.

[21] Appl. No.: 09/209,866

[22] Filed: Dec. 11, 1998

Related U.S. Application Data

[60] Provisional application No. 60/069,569, Dec. 12, 1997.

[51] Int. Cl.$^7$ ............................................. H01L 21/00
[52] U.S. Cl. ..................... 438/23; 438/46; 310/40 MM
[58] Field of Search ................................ 438/22, 23, 26, 438/27, 34, 42, 46, 47, 95 G; 310/308, 309, 40 MM

[56] References Cited

U.S. PATENT DOCUMENTS

| | | |
|---|---|---|
| 5,025,346 | 6/1991 | Tang et al. . |
| 5,536,988 | 7/1996 | Zhang et al. .............................. 310/309 |
| 5,581,571 | 12/1996 | Holonyak et al. . |
| 5,628,917 | 5/1997 | MacDonald et al. ......................... 216/2 |
| 5,640,133 | 6/1997 | MacDonald et al. ..................... 333/197 |
| 5,719,891 | 2/1998 | Jewell ........................................ 372/45 |
| 5,747,366 | 5/1998 | Brillouet et al. ........................... 438/44 |
| 5,764,671 | 6/1998 | Lebby et al. ............................... 372/45 |

OTHER PUBLICATIONS

"Fabrication of Submicron High–Aspect–Ratio GaAs Actuators", by Z. Lisa Zhang & Noel C. MacDonald, Journal of Microelectromechanical Systems, vol. 2, No. 3, Jun., 1993, pp. 66–73.

"Laterally Driven Polysilicon Resonant Microstructures", by William C. Tang, Tu–Cuong H. Nguyen and Roger T. Howe, Proceedings IEEE Micro Electro Mechanical Systems, pp. 53–59, Feb. 1989.

"Electrostatic–comb Drive of Lateral Polysilicon Resonators", by William C. Tang, Tu–Cuong H. Nguyen, Michael W. Judy & Roger W. Howe, Transducers '89, Proceedings of the 5$^{th}$ International Conference on Solid–State Sensors and Actuators and Eurosensors III, vol. 2, pp. 328–331, Jun. 1990.

"Semiconductor Lasers on Si Substrates Using the Technology of Bonding by Atomic Rearrangement", by Y.H. Lo, R. Bhat and D.M. Hwang, C. Chua and C.H. Lin, Appl. Phys. Lett., vol. 62. No. 10, Mar. 8, 1993, pp. 1038–1040.

"Integration of GaAs Vertical–Cavity Surface Emitting Laser on Si by Substrate Removal", by Hsi–Jen J. Yeh and John S. Smith, Appl. Phys. Lett., vol. 64, No. 12, Mar. 12, 1994, pp. 1466–1468.

*Primary Examiner*—Charles Bowers
*Assistant Examiner*—Keith Christianson

[57] ABSTRACT

A III-V compound light emitter is integrated with Si-based actuators. The Proposed devices take advantage of the superior optical properties of III-V compounds and the superior mechanical properties of Si, as well as mature fabrication technologies of Si-Micro-Electro-Mechanical Systems (MEMS). The emitter can be a light emitting diode (LED), a vertical cavity surface emitting laser (VCSEL) or an edge emitting laser. Electro or magnetic based actuation from Si-based actuators provides linear or angular movement of the light emitter.

1 Claim, 8 Drawing Sheets

FABRICATION OF SCANNING III-V COMPOUND LIGHT EMITTERS INTEGRATED WITH SI-BASED ACTUATORS

This patent application claims priority to U.S. Provisional Patent Application, Ser. No. 60/069,569, entitled "SCANNING III-V COMPOUND LIGHT EMITTERS INTEGRATED WITH SI-BASED ACTUATORS BY WAFER BONDING" filed on Dec. 12, 1997. The present invention is drawn to a scanning III-V compound light emitter integrated with Si-based actuators.

Solid state semiconductor light emitters are important devices in such diverse applications such as optoelectronic communication systems and high-speed printing systems. It is well-known in the proven art of silicon to provide suspension and actuation schemes, for example, comb drives using bending springs or parallel plate actuation using torsion springs. For optical beam steering applications, these silicon steering elements are typically combined with a light source in a separate package, or even with a light source 'glued' or bonded onto the silicon steering chip. To make an integrated device, it is necessary to develop MEMS fabrication technology for GaAs-based materials, such techniques including deep etching techniques to make high aspect ratio structures. It is highly desirable to combine the optical characteristics of GaAs materials with the structural and electrical characteristics of silicon.

U.S. Pat. Nos. 5,536,988, 5,640,133, 5,629,790 and 5,025,346, "Fabrication of Submicron High-Aspect-Ratio GaAs Actuators" Zhang et al., Journal of Microelectromechanical Systems Vol. 2, No.2, p. 66–73, June 1993, "Laterally Driven Polysilicon Resonant Microstructure" Tang et al., IEEE Micro Electro Mechanical Systems pp. 53–59, February 1989 (reprint), and "Electrostatic-comb Drive of Lateral Polysilicon Resonators" Tang et al., Transducers '89, Proceedings of the 5th International Conference on Solid-State Sensors and Actuators and Eurosensors III, Vol. 2, pp. 328–331, June 1990 (reprint) show the state of the art of micro-electromechanical systems (MEMS) actuators and methods of fabricating these devices. U.S. Pat. Nos. 5,747,366 and 5,719,891, H. J. Yeh, and J. S. Smith, "Integration of GaAs VCSEL on Si by substrate removal", Appl. Phys. Lett. Vol 64, pp. 1466–1468 (1994) and Y. H. Lo, et al. "Semiconductor lasers on Si substrates using the technology of bonding by atomic rearrangement" Appl. Phys. Lett. Vol. 62, pp. 1038–1040 (1993) show the state of the art of semiconductor light emitting assemblies.

U.S. patent application Ser. No. 08/761,681, entitled "Raster Output Scanner with Pivotal Mirror for Process Direction Light Spot Position Control" filed on Dec. 6, 1996 and assigned to the same assignee as the present invention teaches a MEMS torsional control device.

U.S. patent application Ser. No. 08/940,867, entitled "Highly compact Vertical Cavity Surface Emitting Lasers" filed on Sep. 30, 1997 and assigned to the same assignee as the present invention teaches the formation of highly compact and well-defined VCSELs.

U.S. patent application Ser. No. 09/173,329, entitled "Monolithic Scanning Light Emitting Devices" filed on Oct. 15, 1998 and assigned to the same assignee as the present invention teaches a micro-machined movable light emitting assembly formed on or from a III-V substrate, preferably a GaAs substrate. The movable light emitting assemblies are actuated using force generators to generate various degrees of movement depending upon the type of stage suspension and actuation mechanism used.

All of the above references are hereby incorporated by reference.

SUMMARY OF THE INVENTION

The present invention is drawn to integrating GaAs-based optical devices with Si-based MEMS structures. The proposed devices utilize superior optical properties of III-V compounds and superior mechanical properties of Si, as well as mature fabrication technologies of Si-MEMS. The emitter can be a light emitting diode (LED), a vertical cavity surface emitting laser (VCSEL) or an edge emitting laser. Electro or magnetic based actuation from Si-based actuator provides linear or angular scanning.

DETAILED DESCRIPTION OF THE INVENTION

Figure 1:
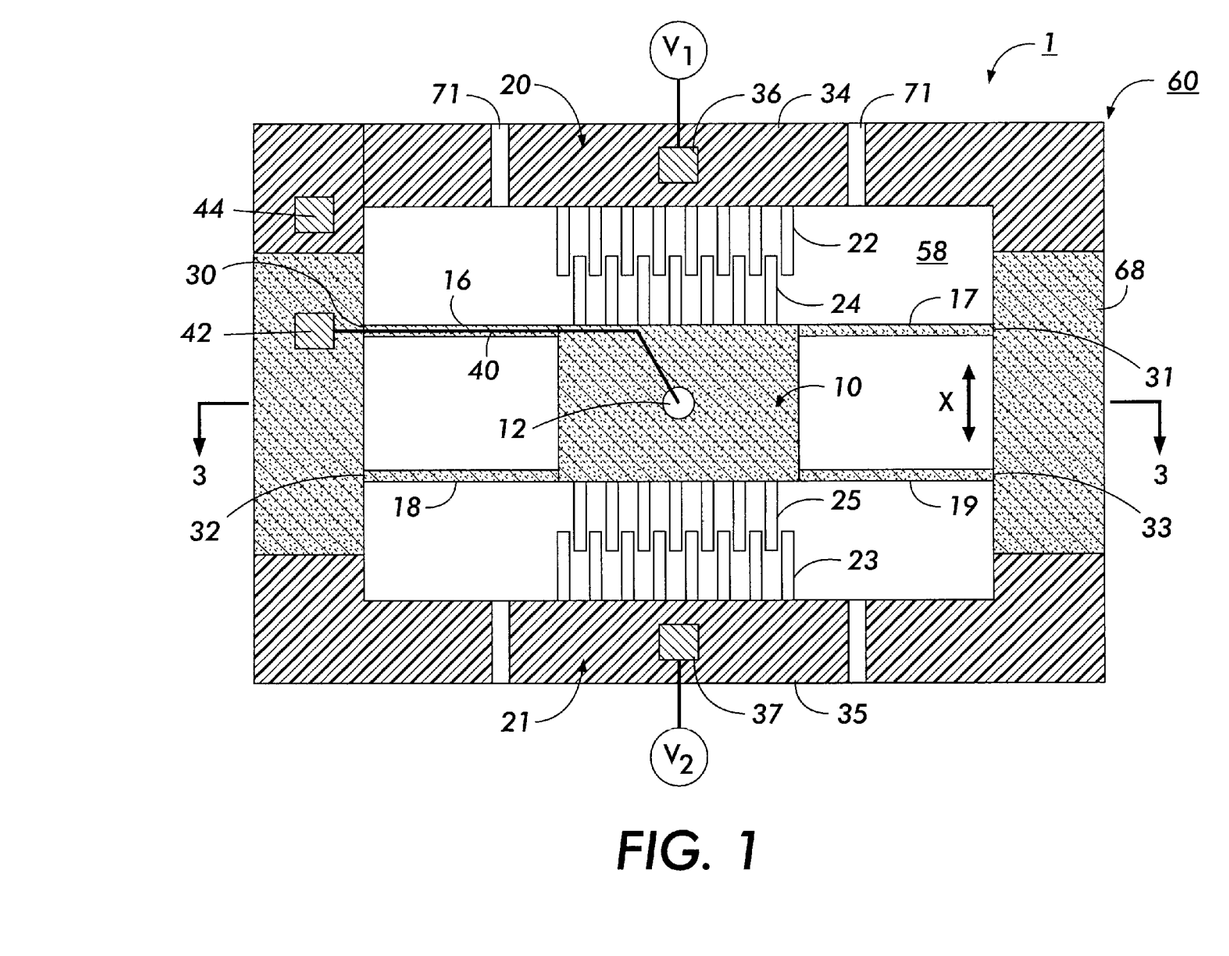
FIG. 1 shows a top view of a light emitting assembly movably supported on a semiconductor substrate.

FIG. 1 is a top view of a movable stage with a light emitter, actuation mechanism and suspension system integrated with a substrate. The light emitter preferably takes the form of any III-V based emitters, for example, vertical cavity surface emitting lasers (VCSELS), light emitting diodes (LEDS), and edge emitting light emitters. In the particular embodiment shown in FIG. 1, VCSEL shuttle 1 has movable VCSEL stage 10 which supports VCSEL 12. Stage 10 has one mechanical degree of freedom (x) and is suspended with support members 16–19. The III-V material remains on the shuttle structure as shown in the shaded regions 10 and 20 as well as on VCSEL stage 10. Basically the VCSEL material is etched away except in the shaded region to expose the n-Si buffer layer to allow the fabrication of comb-drive structures on the n-Si buffer layer. Support members 16–19 may take the form of straight bending springs (as shown), and may also include other configurations known from the silicon art, for example, folded beams. Mechanical designs such as 'folded spring' suspensions, tapered or stepped comb fingers, x/y folded spring suspensions, archimedian spiral springs for a rotational degree of freedom, etc., which are well-known in silicon structures, may be implemented in the III-V structures. The in-plane shape of structures (stage, springs, combs) is relatively arbitrary within fairly wide limits. The III-V material remains on the shuttle structure as shown in the shaded regions as well as on VCSEL stage 10 and support members 16–19. Movement of stage 10 is actuated with electrostatic comb drives 20 and 21, all anchored to substrate 50. Electrostatic comb drives may be replaced with any actuation system as is well known in the microelectromechanical systems (MEMS) art, for example, magnetic, thermal and piezoelectric systems. As shown, stage 10 is moved by applying voltage V1 between fixed fingers 22 and movable fingers 24 of comb drive 20 at comb drive contact pad 36 and applying a voltage V2 between fixed fingers 23 and movable fingers 25 of comb drive 21 at comb drive contact pad 37. The fixed fingers are electrically isolated from the movable fingers by isolation grooves 70 and 71 etched down to the oxidation layer 58. The VCSEL and the movable combs share one common ground 44 deposited top of buffer layer 60.

Electrostatic forces cause movable fingers 24 and 25 of comb drives 20 and 21 to 'pull in' to minimize the energy stored in the system. Movable fingers 24 and 25 are attached to stage 10 with its integrated VCSEL 12 and stage 10 is suspended with flexible support members 16–19. Support members 16–19 are anchored to substrate 50 at anchor points 30–33, while fixed combs 22 and 23 are anchored to substrate 50 at anchor points 34 and 35. In a first order approximation, the stage position is proportional to the force, which is proportional to the square of the applied voltage. Conductive heat transfer through the suspension support members sinks the waste heat from the VCSEL into the substrate. The low threshold current, characteristic for VCSELs, makes it possible to keep the temperature of the stage under control.

An important metallization/contacting issue is how to get the electrical connections for the VCSEL(s) 12 onto the mechanically suspended stage 10. In the embodiment shown, conductive line 40 is run from VCSEL contact pad 42 on substrate 50 to stage 10 and to VCSEL 12. Conductive line 40 runs over the neutral fiber of suspension support member 16, and is electrically isolated from suspension support member 16. The 'neutral fiber' is the stress free centerline of the flexing support member. The width of conductive line 40 is chosen sufficiently small relative to the width of the support member and runs along the centerline of the support member in order to minimize mechanical stress, which allows conductive line 40 to survive the mechanical scanning motion of the beam. The electrical isolation of conductive line 40 from suspension support member 16 may be accomplished in many ways, for example, with a dielectric layer underneath conductive line 40 or insulating the suspension beam surface using shallow ion implantation.

Figure 2:
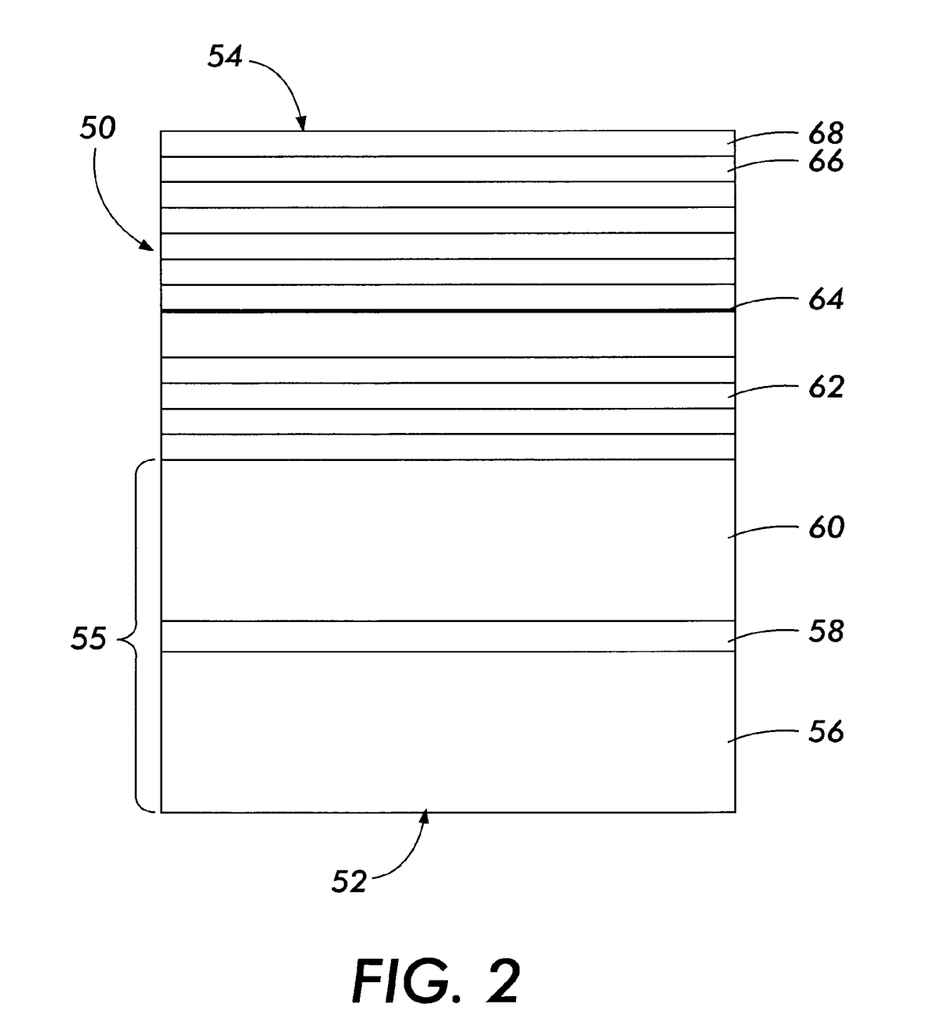
FIG. 2 shows the cross-section of the semiconductor substrate in FIG. 1 prior to any processing.

FIG. 2 is a cross-sectional view of substrate 50 prior to any etching with substrate back side 52 and wafer front side 54. In this embodiment, the substrate structure includes layers of doped n-Si substrate 56, etch stop layer 58, buffer layer n-type Si 60, n-type quarter wave distributed Bragg reflector (DBR) mirror layers 62, active region 64, p-type DBR mirror 66 and P+contact layer 68. In a preferred embodiment layer 56 is n-Si substrate, etch stop layer 58 is SiO$_2$, buffer layer 60 is n-Si, n-DBR layer 62 is n-Al$_x$Ga$_{1-x}$As/Al$_y$Ga$_{1-y}$ As, active layer 64 is a quantum well layer sandwiched by AlGaAs potential confinement layers, p DBR layer is p⁻Al$_x$Ga$_{1-x}$ As(x~0.05)/Al$_y$Ga$_{1-y}$ As (y~0.95) and p+contact layer is GaAs.

Figure 3:
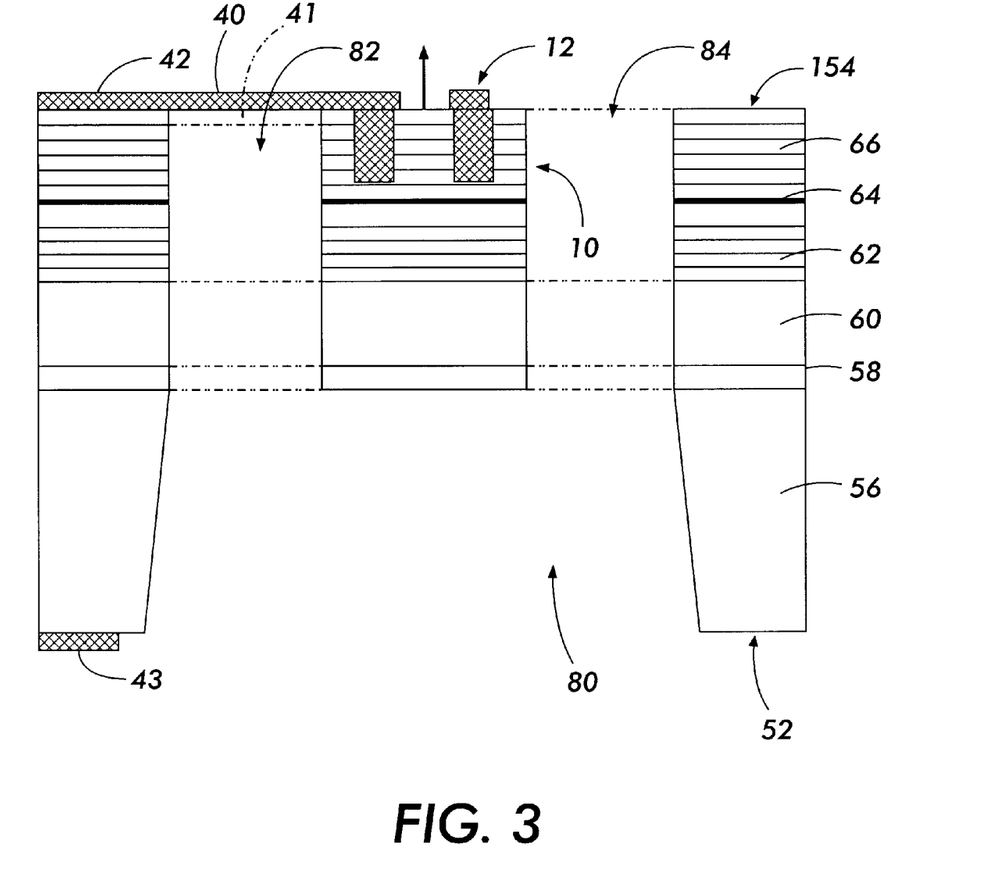
FIG. 3 shows a cross-sectional view of the light emitting assembly in FIG. 1 along line 3—3.

FIG. 3 is a cross sectional view along line 3—3 of FIG. 1, and shows the VCSEL structure described in FIG. 2 after the VCSEL structure has been processed or etched. In the fabrication process, the III-V material (VCSEL top layer 68 shown) is etched away from the substrate except for in the shaded regions to expose the n-Si buffer layer to allow the fabrication of comb-drive structures on the n-Si buffer layer. Etch isolation grooves 70 and 71 are formed in the fabrication process. The current of VCSEL 12 flows through the n-GaAs layer in the long suspended beam 18 to the n-Si layer 60. Substrate 50 is etched from the substrate back 52 to provide substrate opening 80 and layers 56, 58, 60, 62, 64, 66 and 68 have been removed to form stage openings 82 and 84. Implantation region 41 extends underneath conductive line 40 and is insulating so that the current can only flow into the active region of the VCSEL from VCSEL contact pad 42. Substrate contact 43 is deposited on the corner of the substrate back side 152.

In a preferred embodiment, the GaAs-based VCSEL structure is bonded on top of a commercially available Simox (Si on insulator) wafer 55 composed of layers 56, 58 and 60. An inverted GaAs based VCSEL structure grown on GaAs may be bonded to Simox wafer 55, using conventional bonding techniques, for example, wafer fusion bonding. The bonding can be done through wafer to wafer direct bonding or through an intermediate layer of metal or dielectric. In the case of metal bonding, indium or Ge—Au may be needed. For dielectric, spin-on glass is an example. In a preferred embodiment, direct wafer bonding is used. To assist good wafer bonding, an InP or InGaP intermediate layer may be used which can be grown on the Si wafer or on top of the VCSEL wafer or both. Examples of useful bonding techniques are taught in U.S. Pat. Nos. 5,728,623 and 5,493,986, which are hereby incorporated by reference. The Si/SiO$_2$/Si structure will be useful for electrical isolation, which will be discussed in more detail later on. In one example, the n-Si layer 60 is 10 to 20 $\mu$m thick, which could be thicker to stand the stress in released beams and membranes after wafer bonding, SiO$_2$ layer 58 is 500 $\mu$m thick, and n-Si layer 56 is 400 $\mu$m thick.

After bonding, the GaAs substrate is removed selectively by wet etching, leaving the VCSEL epi-structure of approximately 7 $\mu$m thick on top of the Simox wafer, shaded regions, and stage support members 16–19.

A scanning light emitting shuttle can be fabricated from substrate 50 using Si-MEMS fabrication technology. VCSEL stage 10 is suspended in the center by support members 16–19 fabricated from the layer 60. Linear scanning motion of the stage 10 is realized through comb drives 20 and 21 attached to the stage and the Simox substrate 55, which are fabricated monolithically with the VCSEL table from the Si substrate. Comb drive fingers 22–25 are fabricated from n-Si layer 60 as well. With a driving voltage across the comb drives, the VCSEL shuttle is scanned in a linear motion with a displacement of tens of micro-meters.

The VCSEL may be fabricated by oxidation techniques to oxidize an inserted Al$_x$Ga$_{1-x}$As (x~0.98) layer to form an oxide aperture for optical and electrical confinements, In FIGS. 1 and 3, only one VCSEL is drawn with its p-connect wire running over the center line of one suspended beam. It is possible to put two VCSELs on the shuttle side by side by utilizing another suspension beam. Comb fixed fingers 22 and comb movable fingers 24 of comb drive 20 and comb fixed fingers 23 and comb movable fingers 25 of comb drive 21 are electrically isolated from one another. Since the fingers of each comb are of opposite polarities coupled by capacitance only, electrical isolation is needed which has to stand over 100 V electrical bias without breakdown. In one example, this is realized by using etch isolation grooves 70 and 71 to etch down to etch stop layer 58 of about 500 to 1000 nm thick underneath the VCSEL structure, When a bias is applied by V, between the comb drive fingers 22 and 24, VCSEL shuttle 100 is scanned in a linear motion as indicated by the x arrow and when a bias is applied by V$_2$ between comb drive fingers 23 and 25, VCSEL shuttle 1 is scanned in the opposite x direction.

Since the current driving the VCSEL flows through the n-DBR and then the n-Si layer, the electric transport property at the bonding interface is very important for low resistance. Lo, et al. has reported a series resistance of 100 ohms for a GaAs edge emitting laser flip bonded to a p-Si substrate. Highly doped n-GaAs and n-Si might provide much lower impedance for carrier transport at the interface. If the driving current for the VCSEL is on the order of hundreds of pLA, the voltage drop across the interface would be less than 0.1 volts.

The VCSEL structure then undergoes ion implantation process for isolation and metallization. Holes flows through the p-DBR region confined by the ion implanted area and into that portion of the active layer which lies below the p-DBR cavity and recombine with electrons flowing upwards from the N-DBR below and producing photon emission and optical amplification. At sufficiently high current flow, this optical amplification in combination with feedback from the DBR mirrors will result in laser oscillation and emission within the VCSEL cavity. Regions formed by the ionimplantation isolation process are highly resistive.

The VCSEL scanners can be packaged in TO-type packages (e.g. 1 VCSEL per package, or more if desirable) with built-in short focal length lens. A 'small' stage scan length (e.g. 5 $\mu$m) can, within limits, be considerably magnified by placing the VCSEL scanner close to a short focal length lens and using a comparatively large throw distance (e.g. 1" optical scan length feasible for a 50 $\mu$m mechanical scan amplitude using a 10 inch or 20 inch throw distance (250×, 125× respectively).

Figure 4:
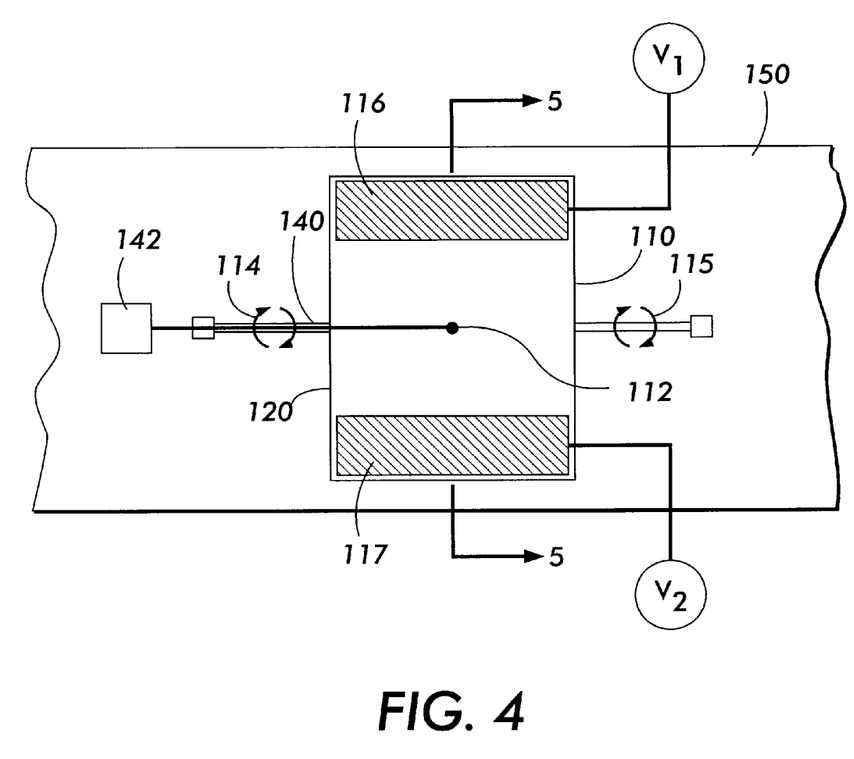
FIG. 4 shows a top view of a rotating light emitting assembly.

FIG. 4 shows a rotating VCSEL fabricated from the bonded structure. The VCSEL is bonded to a torsional Si-based actuator, which can be rotated by bias voltages across the bottom electrodes and the Si platform, with an angular rotation range of ±40°. A micro-lens may be placed on top of the VCSEL aperture for beam collimation. The lens can be fabricated by any conventional lens fabrication process, such as photoresist reflow or pattern transferring to a $SiO_2$ layer. The Si platform can be rotated two dimensionally as well with another degree of rotation by electrostatic or magnetic actuation.

Figure 5:
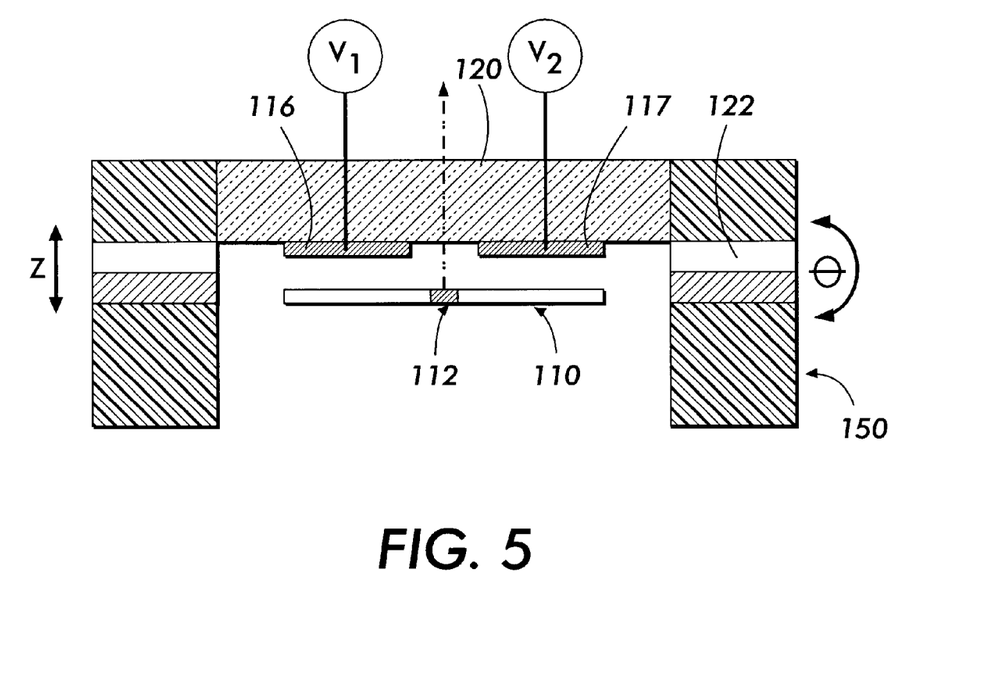
FIG. 5 shows a cross-sectional view of FIG. 4 along line 5/5.

VCSEL 112 is supported on stage 110. Semiconductor substrate 150 has VCSEL 112 on stage 110 suspended from suspension support members 114 and 115. The actuation is done with parallel plate capacitors formed between stage 110 and electrodes 116 and 117 on glass cover 120. "Raster Output Scanner with Pivotal Mirror for Process Direction Light Spot Position Control", U.S. patent application Ser. No. 08/761,681, filed on Dec. 6, 1996 cited earlier, discloses the manufacture and operation of a pivoting mirror, the operation of moving stage 110 being similar in operation to that of the pivoting mirror. Differential actuation of electrodes 116 and 117 produces a Θ) motion; common actuation of electrodes 116 and 117 produces a z-motion. The dimensions and geometry of the suspension support members can be optimized to either favor a Θ or z- degree of freedom. Conductive line 140 electrically connects VCSEL 112 with contact pad 142. FIG. 5 is a cross-sectional view of FIG. 4, along line 5—5. Glass cover 120 is supported above substrate 150 by seal 122.

Figure 6:
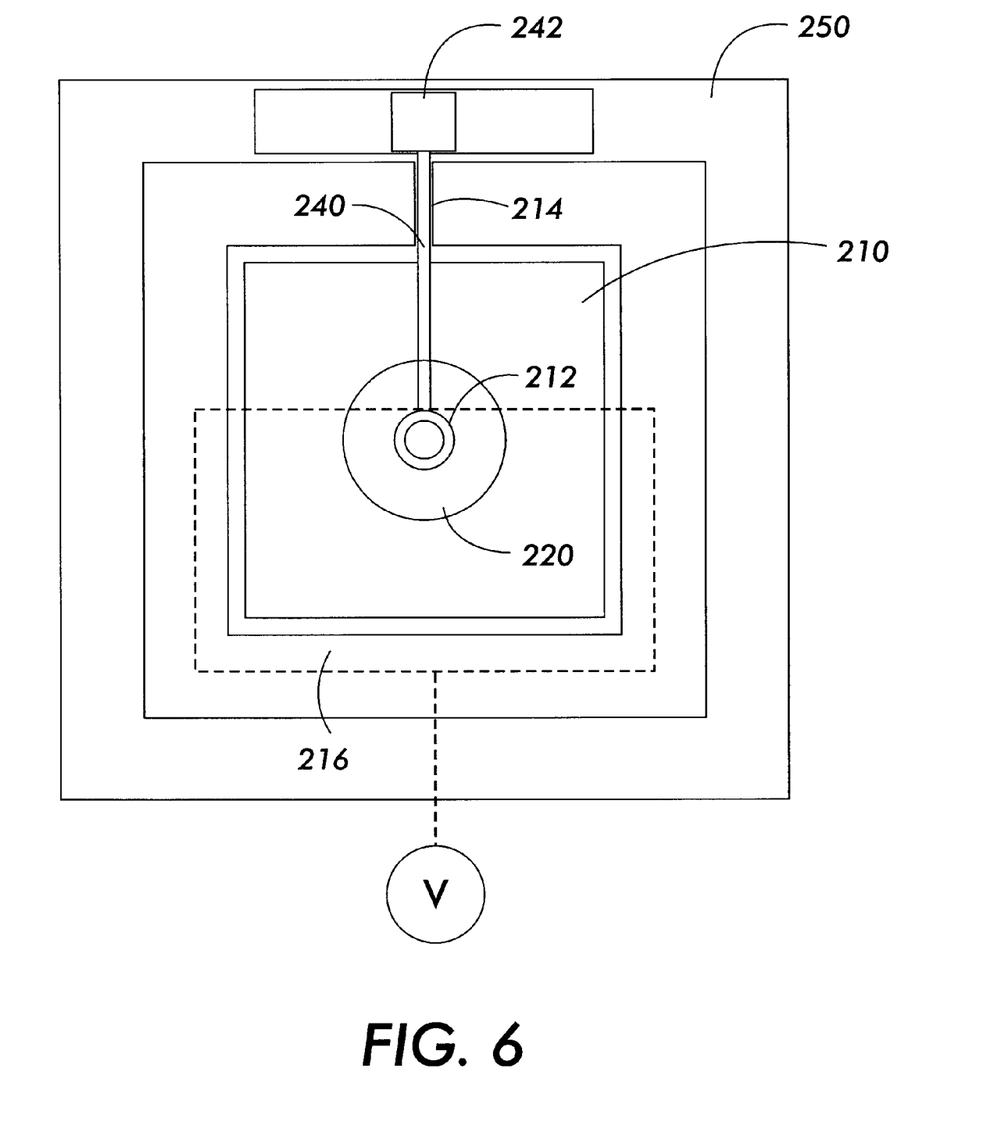
FIG. 6 shows a top view of another embodiment of a rotating light emitting assembly.

Another configuration for a rotating light emitting device is a VCSEL 212 on VCSEL stage 210 fabricated on a Si cantilever platform shown in FIG. 6. A microlens 220 may be placed on top of the VCSEL aperture for beam collimation. Microlens 220 can be fabricated by any conventional lens fabrication process, such as photoresist reflow or pattern transferring to a $SiO_2$ layer. The Si platform can be rotated two dimensionally by electrostatic or magnetic actuation.

VCSEL stage 210 with VCSEL 212 is attached to substrate 250 by cantilever beam 214. The actuation is accomplished by actuating electrode 216 on substrate 250 by applying voltage V. Actuation of electrode 216 produces an angular motion of stage 210 in the direction of electrode 216. Conductive line 240 electrically connects VCSEL 212 with contact pad 242.

Figure 7:
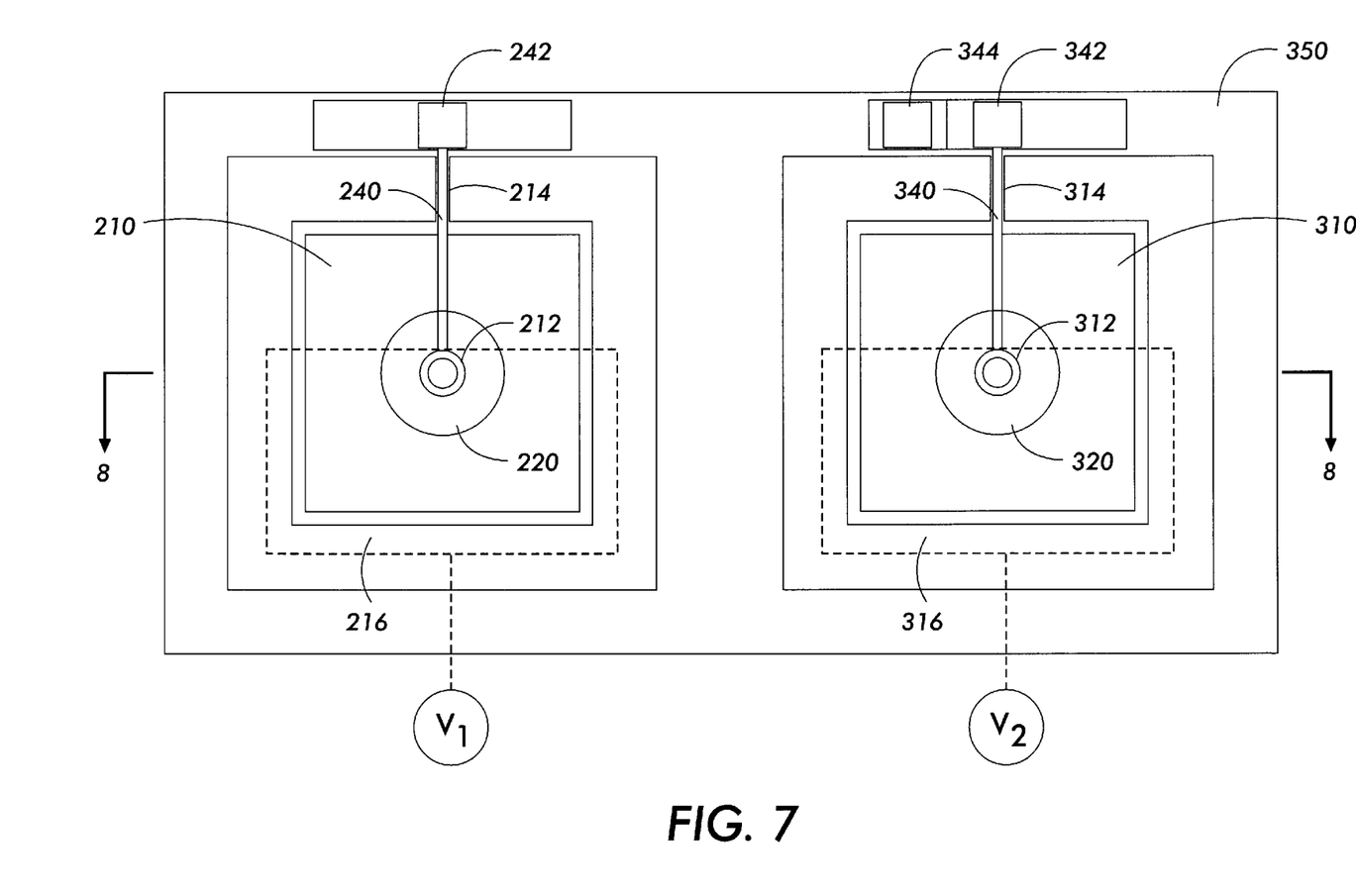
FIG. 7 shows a top view of a dual color rotating light emitting assembly array.

FIG. 7 shows a dual-color rotating VCSEL array. Two or more VCSEL structures of different colors are shown bonded on top of semiconductor substrate 350. The first VCSEL 212 and supporting structure has a configuration similar to that of FIG. 6, with n-type quarter wave distributed Bragg reflector (DBR) mirror layers 262, active region 264, p-type DBR mirror 266.

Figure 8:
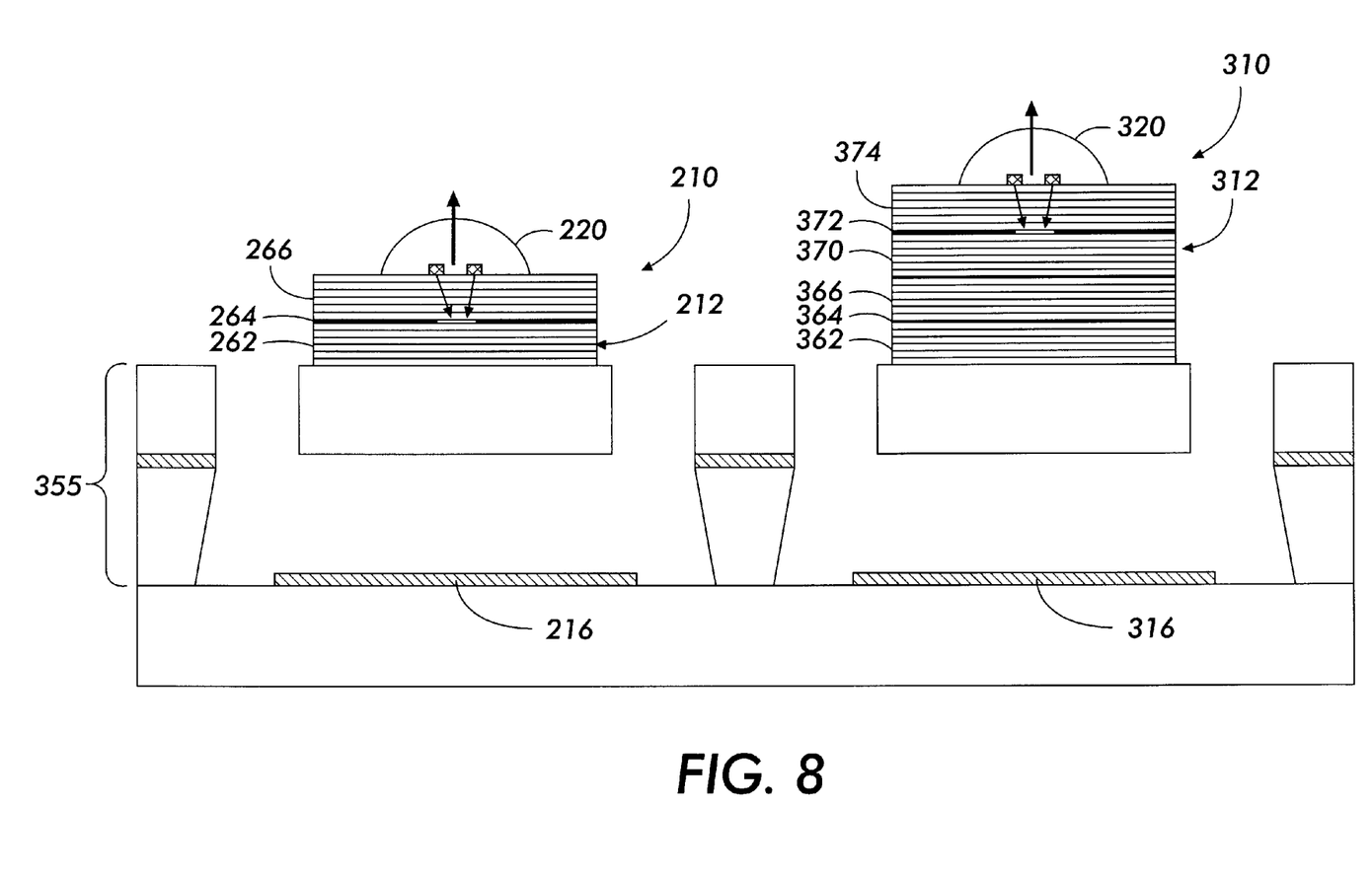
FIG. 8 shows a cross-sectional view of FIG. 7 along line 8/8.

VCSEL stage 310 with VCSEL 312 and microlens 320 is attached to substrate 350 by cantilever beam 314. The movement of stage 310 is accomplished by actuating electrode 316 on substrate 350 by applying voltage V2. Actuation of electrode 316 produces an angular motion of stage 310 in the direction of electrode 316. Conductive line 340 electrically connects VCSEL 312 with contact pad 342. FIG. 8 shows a cross-sectional view of FIG. 7 along line 8—8. VCSEL 312 is a different color than VCSEL 212. VCSEL 312 may be fabricated by first bonding one VCSEL wafer, for example a red VCSEL, with n-type quarter wave distributed Bragg reflector (DBR) mirror layers 362, p-type DBR mirror 366 to the simox substrate 355 and then removing the substrate of the red VCSEL, followed by bonding of another VCSEL, for example an infrared VCSEL, with n-type quarter wave distributed Bragg reflector (DBR) mirror layers 370, active region 372, p-type DBR mirror 374 on top of the first VCSEL wafer. For the infrared VCSEL on top, lateral contact is needed for its cathode 344 on top of the n-GaAs buffer layer.

As those skilled in the art will appreciate, other various modifications, extensions, and changes to the foregoing disclosed embodiments of the present invention are contemplated to be within the scope and spirit of the invention as defined in the following claims.

We claim:

1. A method of making a movable light emitting assembly, comprising:

a substrate having a top and a bottom made of semiconductor material, the substrate including a doped layer on the bottom of the substrate, an etch stop layer, a buffer layer, and light source layers and;

forming a light source from the light source layers;

forming a light source support which movably supports the light source;

forming at least one suspension member, each suspension member attached at a first end to the light source support and at a second end to the substrate thereby suspending the light support; and forming at least one force generator which moves the light support.

* * * * *

UNITED STATES PATENT AND TRADEMARK OFFICE
CERTIFICATE OF CORRECTION

| | | |
|---|---|---|
| PATENT NO. | : 6,054,335 | |
| APPLICATION NO. | : 09/209866 | |
| DATED | : April 25, 2000 | |
| INVENTOR(S) | : Decai Sun et al. | |

It is certified that error appears in the above-identified patent and that said Letters Patent is hereby corrected as shown below:

Column 1, line 9, after "filed on Dec. 12, 1997." insert as a new paragraph:

--This invention was made with Government support under 70NANB8H4014 awarded by NIST. The Government has certain rights in this invention.--

Signed and Sealed this

Thirty-first Day of July, 2007

JON W. DUDAS
*Director of the United States Patent and Trademark Office*